(12) United States Patent
Nguyen et al.

(10) Patent No.: US 6,245,595 B1
(45) Date of Patent: Jun. 12, 2001

(54) TECHNIQUES FOR WAFER LEVEL MOLDING OF UNDERFILL ENCAPSULANT

(75) Inventors: Luu Nguyen, Sunnyvale; Hem P. Takiar; Ethan Warner, both of Fremont; Shahram Mostafazadeh, San Jose; Joseph O. Smith, Morgan Hill, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/359,074

(22) Filed: Jul. 22, 1999

(51) Int. Cl.[7] ............... H01L 21/44; H01L 21/48; H01L 21/50; H01L 21/00; B23K 31/02
(52) U.S. Cl. ............ 438/108; 438/26; 438/127; 438/106; 228/180.22
(58) Field of Search .............. 438/26, 106, 108, 438/112, 114, 127; 228/180.22

(56) References Cited

U.S. PATENT DOCUMENTS

| | | | |
|---|---|---|---|
| 5,045,914 | * | 9/1991 | Casto et al. .......................... 357/70 |
| 5,765,744 | * | 6/1998 | Tatumi et al. ...................... 228/254 |
| 5,872,051 | * | 2/1999 | Fallon et al. ....................... 438/616 |
| 6,074,896 | * | 6/2000 | Dando ............................... 438/114 |
| 6,088,914 | * | 7/2000 | Variot et al. ......................... 29/840 |
| 6,096,574 | * | 8/2000 | Smith ................................. 438/106 |
| 6,121,689 | * | 9/2000 | Capote et al. ...................... 257/783 |

* cited by examiner

Primary Examiner—Vu A. Le
Assistant Examiner—Adam Pyonin
(74) Attorney, Agent, or Firm—Beyer, Weaver & Thomas LLP

(57) ABSTRACT

A method and apparatus for forming a layer of underfill encapsulant on an integrated circuit located on a wafer are described. As a flip chip, the integrated circuit has electrically conductive pads, most of which have a solder ball attached thereto. Most of the solder balls have been flattened in order to provide an enlarged solder wetting area. A layer of underfill encapsulant is injected onto the integrated circuit under pressure to form a layer of underfill encapsulant that is then pre-cured. The integrated circuit is mounted to a substrate and the substrate and the integrated circuit are electrically coupled by a solder reflow operation which also finally cures the underfill encapsulant.

15 Claims, 7 Drawing Sheets

TECHNIQUES FOR WAFER LEVEL MOLDING OF UNDERFILL ENCAPSULANT

FIELD OF THE INVENTION

The present invention relates generally to flip chip packaging for integrated circuits. More particularly, it relates to flip chips that have an integral layer of underfill material and to methods for and devices for packaging such flip chips.

BACKGROUND OF THE INVENTION

There are a number of conventional processes for packaging integrated circuits. One approach which is commonly referred to as "flip chip" packaging generally contemplates forming solder bumps (or other suitable contacts) directly on I/O pads formed on an integrated circuit die. The die is then typically attached to a substrate such as printed circuit board or package substrate such that the die contacts directly connect to corresponding contacts on the substrate. That is, the die is placed on the substrate with the contact bumps facing corresponding contacts on the substrate. The solder contact bumps are then reflowed to electrically connect the die to the substrate.

When a flip chip is attached to the substrate, an air gap typically remains between flip chip and substrate. This gap is commonly filled with material that is flowed into the gap in liquid form and is then solidified. This material is generally a mixture of a resin and small silica spheres and is generally called underfill. The underfill material is typically applied in liquid form from a dispenser at one edge of a flip chip. The material then flows into the narrow gap and spreads across the flip chip until finally the entire area of the gap between flip chip and substrate is filled.

There are problems associated with underfill. For example, the operation of applying underfill must be repeated for each flip chip. Repeating such an operation many times adds to the cost of manufacture. Also, as the underfill material flows past solder bumps to fill the gap, separation of glass from resin may occur. The separation of silica spheres from the resin occurs as some silica spheres become trapped as they meet solder ball obstacles. The underfill material will develop streaks of high and low silica concentration. The silica may also separate from the resin by sinking to one side of the gap, thus creating a silica rich side and a resin rich side. This segregation of silica and resin alters the mechanical properties of the filled region and thereby negates the mechanical function of the underfill.

Therefore there is a need for a lower cost underfill application process and there is a need to reduce the amount of silica segregation that occurs.

SUMMARY OF THE INVENTION

To achieve the foregoing and other objects and in accordance with the purpose of the present invention, methods for forming a layer of underfill encapsulant on an integrated circuit are disclosed. In one embodiment, the integrated circuit has electrically conductive pads, selected ones of which have a corresponding bonded solder ball. The solder balls are flattened which has the effect of increasing the available solder wetting area. The layer of underfill encapsulant is then formed by, in one embodiment, injecting underfill encapsulant under pressure onto the integrated circuit. In this way, the flattened solder ball is covered by the encapsulant in such a way that the flattened portion is substantially free of encapsulant. After the layer of underfill encapsulant is formed, it is partially, or pre-cured.

The integrated circuit can be one of a plurality of integrated circuits that populate an active surface of a wafer. In a preferred embodiment, some of the integrated circuits are flip chip integrated circuits.

In another embodiment, a flip chip integrated circuit package is disclosed. The flip chip integrated circuit package includes a substrate having a plurality of substrate bond pads suitable for being electrically coupled to external circuitry. The flip chip integrated circuit package also includes a flip chip integrated circuit having flip chip bond pads. All of the flip chip bond pads have flattened solder balls. The flattened solder balls have correspondingly enlarged wetting areas that are directly aligned to and in direct contact with corresponding substrate bond pads. A substantially uniform layer of underfill encapsulant that is fully cured during a solder reflow is juxtaposed between the substrate and the flip chip integrated circuit.

In yet another embodiment, an apparatus for forming a layer of underfill encapsulant on an integrated circuit having electrically conductive pads is disclosed. The apparatus flattens the solder balls associated with the selected pads as well as forms the layer of underfill adhesive providing for the flattened portion of the solder balls to remain substantially free of underfill encapsulant. The apparatus partially cures the layer of underfill encapsulant.

In still another embodiment of the invention, a method for forming a layer of underfill encapsulant on an integrated circuit having electrically conductive pads some of which have bonded solder balls is described. A portion of selected ones of the solder balls is flattened. The layer of underfill encapsulant is formed on the active surface of the integrated circuit such that the flattened portion of most of the solder balls remains substantially free of encapsulant. The layer of underfill encapsulant is then partially cured.

BRIEF DESCRIPTION OF THE DRAWINGS

The features of the present invention may best be understood by reference to the following description of the presently preferred embodiments together with the accompanying drawings. For the sake of clarity the drawings are not to scale.

DETAILED DESCRIPTION OF THE INVENTION

Figure 1A:
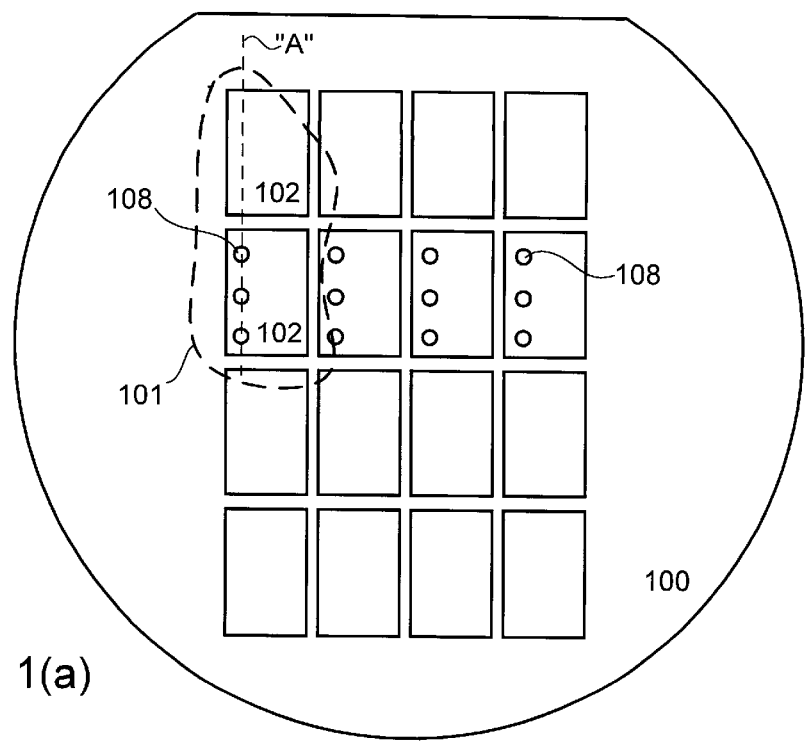
FIG. 1(a) showing a wafer populated by a number of integrated circuits.

In the following description, numerous specific details are set forth in order to provide a thorough understanding of the present invention. In view of this description, it will be obvious to one skilled in the art that the present invention may be embodied in a wide variety of specific configurations. Also, in order not to unnecessarily obscure the present invention, well-known integrated circuit manufacturing steps are not described herein in detail.

The present invention will be described in terms of a flip chip style integrated circuit situated on a wafer suitable for forming a flip chip package. In one embodiment, a wafer having an active surface populated by a number of integrated circuits, some of which are flip chip integrated circuits, is provided. At least some of the flip chip integrated circuits have underfill metallization pads. In the described embodiment, most of the underfill metallization pads have solder balls formed during a solder bump operation. The solder balls are used to electrically couple the associated singulated flip chip integrated circuit to external circuitry by way of, in one implementation, a substrate.

In one implementation, the solder bumped wafer is placed in a mold cavity of a mold that is coupled to a reservoir that contains an amount of underfill encapsulant. In the described embodiment, the reservoir takes the form of a gang pot type arrangement wherein the underfill encapsulant is forced under pressure into the molding cavity. A layer of resilient material (which can take the form of compliant release polymer film such as Teflon® perflouoalkoxy) is placed upon the upper surfaces of the solder bumps substantially coplanar to the active surface of the wafer. During a clamping operation, an enclosing portion of the mold is placed in direct contact with the layer of compliant release film thereby enclosing the solder bumped wafer within the molding cavity. It is important to note, that the pressure exerted by the enclosing portion of the mold on the layer of compliant release film substantially levels the solder bumps by an amount that is determined by the depth of the molding cavity as well as the thickness of the compliant release film.

After the enclosing portion of the mold has been securely clamped, underfill encapsulant is then injected under pressure into the molding cavity. The injected encapsulant forms a substantially uniform layer of underfill encapsulant on the active surface of the wafer. This layer of underfill encapsulant surrounds the solder balls except for the flattened portion that is in direct contact with the compliant release film. In this way, the footprints of those solder balls that are substantially free of underfill encapsulant are commensurably increased thereby increasing the solder wetting area. The layer of underfill encapsulant is then partially cured after which the molded wafer is removed from the molding chamber and singulated into individual dies. The singulated dies are then mounted on a substrate and a solder reflow operation fully cures the underfill encapsulant as well as electrically couples the die to the substrate.

It should be noted, that in some embodiments, the enclosing portion of the mold, or the film itself, includes indentations suitably arranged to provide, in some cases, singulation guides that correspond to saw streets included on the first surface of the wafer. The indentations are also useful in providing essentially indelible markings on the surfaces of the underfill. The grooves induced in the surface of the underfill can also be used as a mechanism to release thermal stress induced in the wafer by the pre-cure.

Figure 1B:
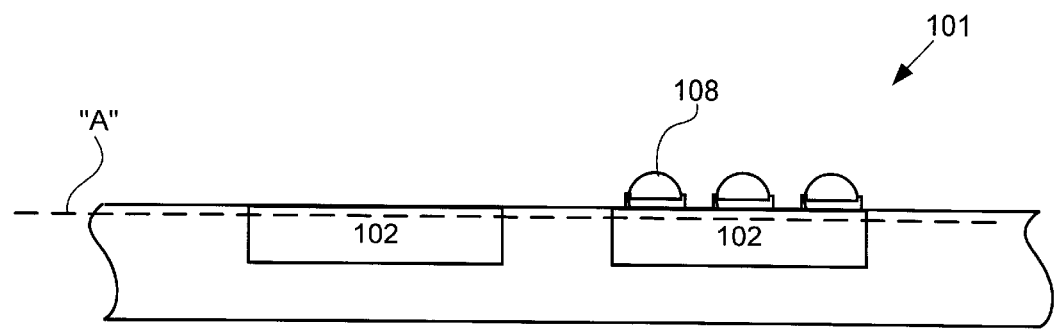
FIG. 1(b) shows a representative cross sectional view of a portion of the wafer shown in FIG. 1(a) as cross section "A".

Referring first to FIG. 1(a) showing a wafer 100 populated by a number of integrated circuits 102. It should be noted that most wafers are formed of silicon but can, of course, be formed of any appropriate semiconductor material including, for example, gallium arsenide (GaAs). Some of the integrated circuits 102 are flip chip integrated circuits suitable for being encapsulated to form flip chip style packages. A representative portion 101 of the wafer 100 is shown in FIG. 1(b) as cross section "A". The portion 101 includes at least one such flip chip integrated circuit 102.

Figure 1C:
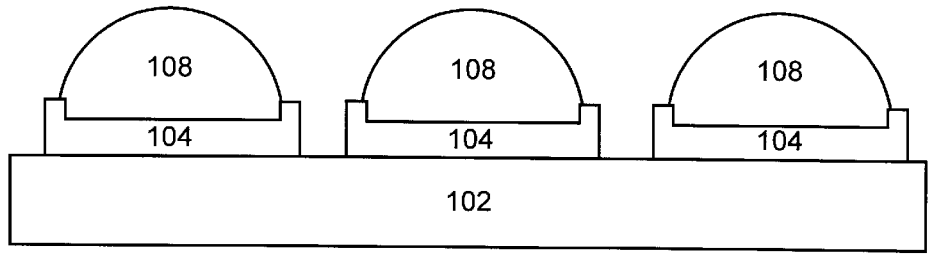
FIG. 1(c) shows an exemplary integrated circuit included in the portion of the wafer shown in FIG. 1(b).

It should be noted that for sake of simplicity only, the following discussion will primarily describe the representative portion 101 of the wafer 100, and more particularly, the flip chip 102. As illustrated in FIG. 1(c), the flip chip 102 has a number of underbump metallization pads 104. The underbump metallization pads 104 are used to electrically couple the flip chip die 102 to external circuitry. In most flip chip package arrangements, the flip chip die 102 is bonded directly to a substrate having electrical interconnects which act as electrical conduits to the external circuit.

In order to form the electrical connection, selected dies on the wafer 100 are solder bumped, by, in one embodiment, applying solder paste in the form of a solder paste island onto those underbump metallization pads 104 included in the selected dies. Once the solder paste islands are in place, a first solder reflow results in the solder paste islands forming (due primarily to the surface tension of the solder) substantially spherical solder bumps 108 as illustrated in FIG. 1(c). It is important to note that the underbump metallization pad 104 provides a barrier to the lateral flow of the solder paste during the first solder reflow operation. The underbump metallization pad 104 also provides a metal barrier between the solder ball 108 and the flip chip die 102.

Figure 2:
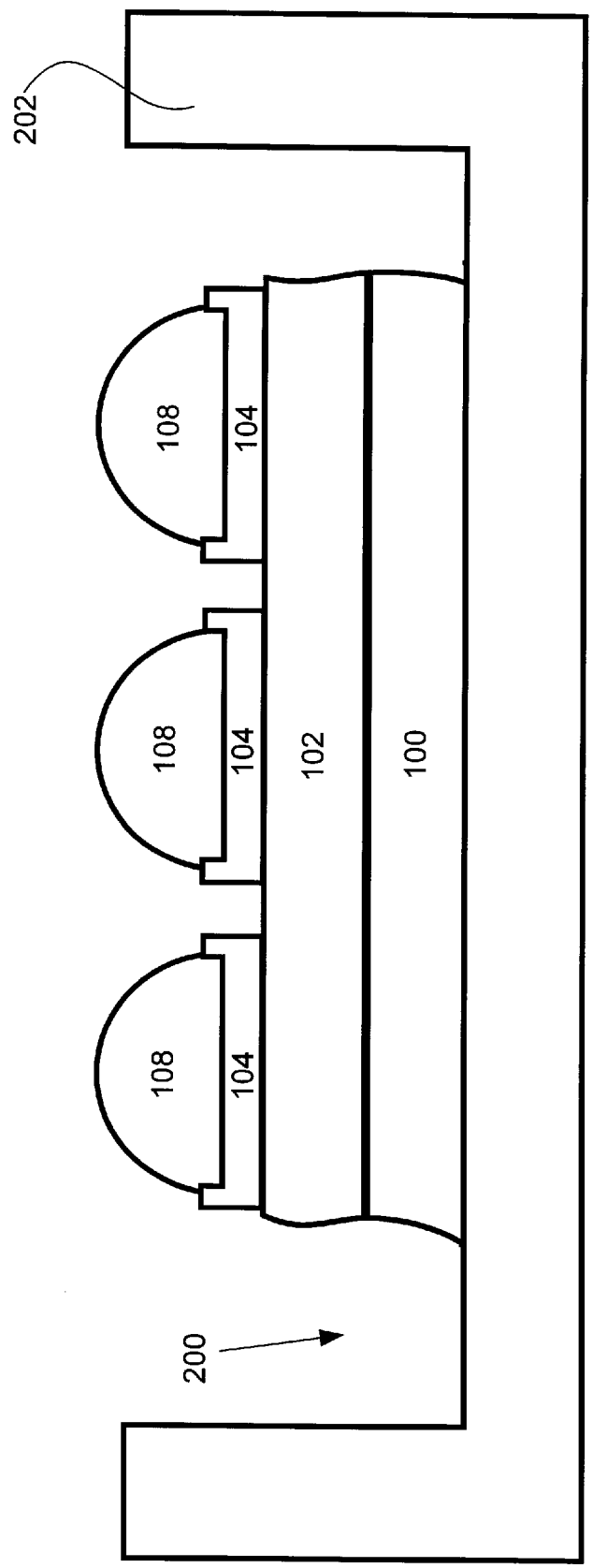
FIG. 2 shows a mold used to form the layer of underfill encapsulant on the wafer shown in FIG. 1(a).

Once the wafer 100 (or selected portions thereof) has been appropriately solder bumped, the wafer 100 is placed in a lower mold cavity 200 of a mold 202 as shown in FIG. 2. The lower mold cavity 200 should be capable of accommodating any size wafer contemplated. The appropriateness of the size of the wafer can be based upon, for example, the total number of dies that is deemed to be economically viable for the particular situation. Typically wafer sizes include, for example, 5-inch, 6-inch, 8-inch, and 12-inch wafers.

Figure 3:
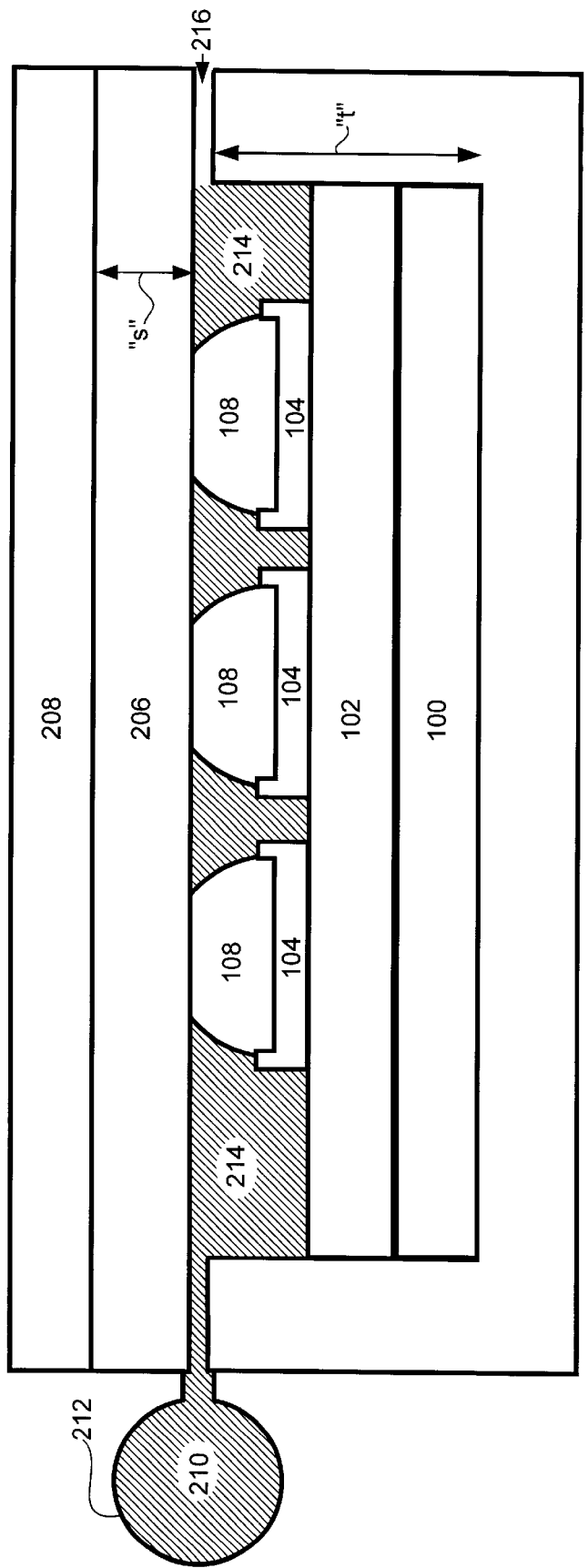
FIG. 3 shows a compliant release film in accordance with an embodiment of the invention.

In the described embodiment, once the wafer 100 is securely placed within the lower mold cavity 202, a compliant release film 206 is placed coplanar to the wafer 100 as shown in FIG. 3. It is important to note that the film 206 must be in direct contact with the upper most portion of the solder balls 108 such that pressure during mold clamping is spread uniformly across the entire wafer. In this way a more consistent and uniform finish is obtained which, in turn, affects the coplanarity of the underfill coating on the wafer 100. The film 206 also helps to assure uniform underfill coating thickness across the wafer 100.

Once the film 206 is in place, an upper portion 208 of mold 202 is then placed in direct contact with the film 206 (i.e., mold clamping) thereby enclosing the solder bumped wafer 100 within the molding cavity 200. It is important to note, that the pressure exerted by the upper portion 208 of the mold on the film 206 substantially levels the solder bumps 108 related to the depth of the molding cavity "t" as well as the thickness of the compliant release film "s". This flattening of the solder bumps 108 also substantially increases the bump footprint (i.e., the exposed solder bump surface area) allowing for better wetting of the solder to the substrate bond pads during subsequent assembly operations.

After the upper portion 208 of the mold has been securely placed, underfill encapsulant 210 is injected into the molding cavity 200. In one embodiment, the mold cavity 200 is coupled to a reservoir 212 that contains the underfill encapsulant 210. As an example, the reservoir 212 can take the form of a gang pot type arrangement where the underfill encapsulant 210 contained therein is forced under pressure into the molding cavity 200. The injected underfill encapsulant 210 forms a substantially uniform layer 214 of underfill encapsulant on the wafer 100 that surrounds the solder bumps 108. It is important to note, however, that due to the presence of the film 206, the flattened upper portions of the solder bumps 108 that are in direct contact with the film 206 remain substantially free of underfill encapsulant. It should be noted that a vent 216 is generally provided to avoid entrapment of gases which typically result in unwanted voided regions in the layer 214.

Once the cavity 200 has been substantially filled by the underfill encapsulant 210, the underfill encapsulant 210 is exposed to low level heat processing referred to as a pre-cure or soft cure. It is primarily due to the desirable effects of the pre-cure in triggering partial curing of the underfill encapsulant that the underfill encapsulant possesses a dual stage curing chemistry. Since the underfill encapsulant 210 is soft cured (or gelled) at an elevated temperature, the return of the wafer 100 to ambient conditions during subsequent assembly operations results in thermally induced shear stresses between the wafer 100 and the underfill encapsulant 210 in proportion to the thickness of the layer 214. It is for at least this reason that for solder bumps 108 that are approximately 130 microns high, for example, before assembly and 100 microns high after assembly, a thickness of the layer 214 of up to approximately 100 microns thick is desirable.

Figure 4:
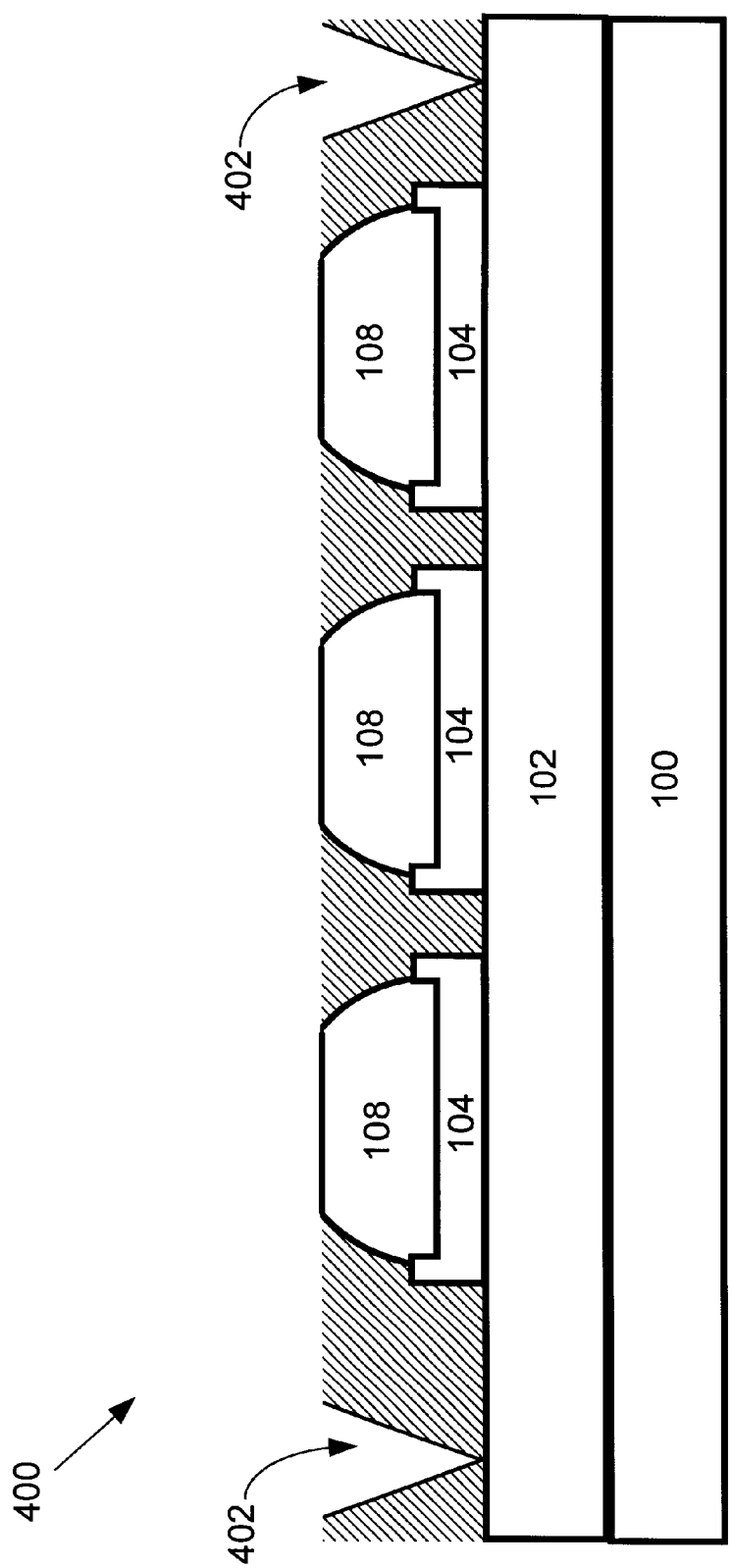
FIG. 4 shows a representative portion of a coated wafer in accordance with an embodiment of the invention.

It should be noted as well that this partial curing allows the encapsulant to reach a sufficiently hard consistency that allows for, in one embodiment, removal of the film 206 from the layer 214. In other embodiments, the film 206 can be left in place in order to facilitate subsequent dicing operations in which the individual integrated circuits are separated from one another. In either case, a coated wafer 400 as shown in FIG. 4 is available for singulation after the pre-cure and removal from the mold 202.

It should be noted that in some implementations of the invention, the upper portion of the mold can have indentations suitable for providing singulation guides 402. Such singulation guides can be used for example, as wafer saw guides. In other cases, the indentations can provide a form of indelible markings on the coated wafer 400. The indentations can also provide a mechanism for relieving stresses induced in the wafer 100 by the various thermal cycles such as the pre-cure.

Figure 5:
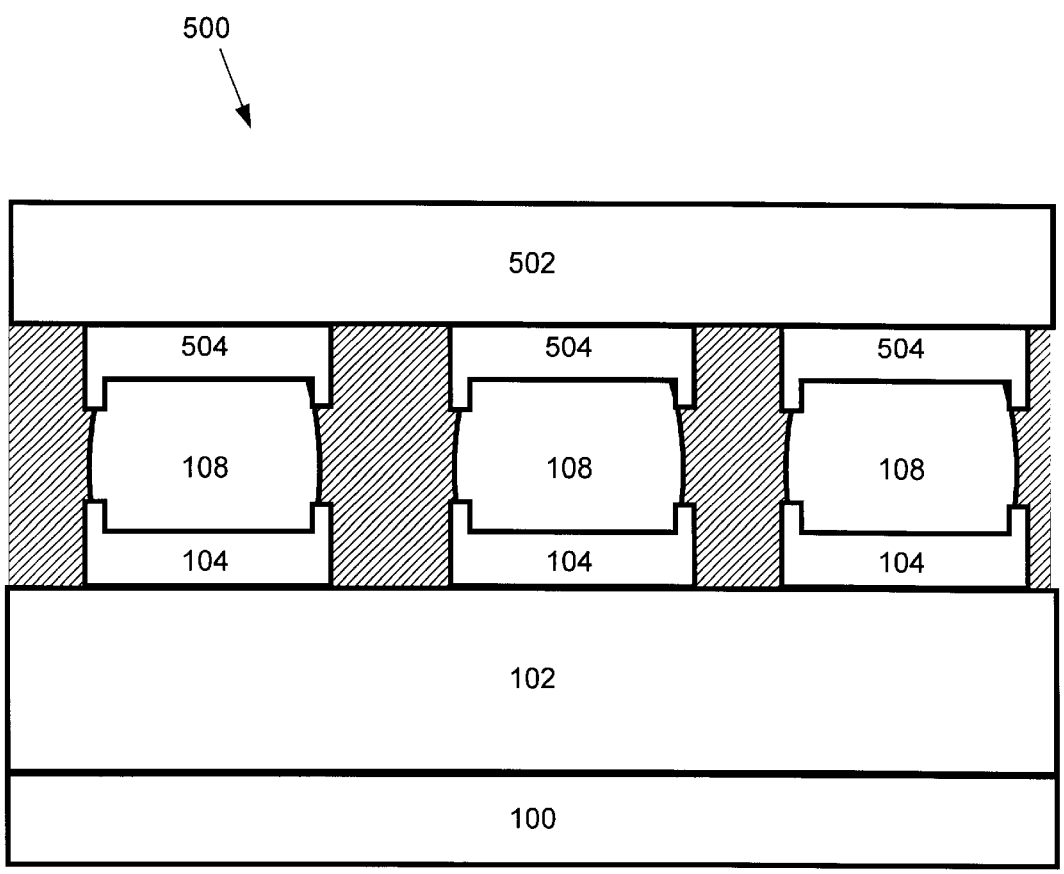
FIG. 5 shows a singulated coated integrated circuit in accordance with an embodiment of the invention.

In one implementation, the coated wafer 400 is then singulated using techniques well known to those skilled in the art. One such technique utilizes a wafer saw whose blade is guided by, for example, those wafer saw guides imprinted in the layer 214. Once the singulation process is completed, a singulated die 500 as shown in FIG. 5 is then ready for final assembly into, for at least this discussion, a flip chip package. In order for the die 500 to communicate with external circuitry, the die 500 is directly aligned to and mounted on a substrate 502 that has substrate bond pads 504. Typically, the substrate bond pads 504 are coupled to the external circuitry by way of traces included in the substrate 502. In other implementations, a lead frame type arrangement can be used. In either case, the die 500 and the substrate 502 are electrically connected during a solder reflow operation. It is during this solder reflow operation that the solder balls 108 form an electrical connection between the underbump metallization pads 104 and corresponding substrate bond pads 504. It is at this point that the enlarged bump footprint presents a substantially larger wetting area than would otherwise be possible using conventional techniques. It is this larger wetting area that provides greater contact area which reduces problems related to, for example, electromigration. Typically, electromigration is caused by high current densities that generally result from small cross sectional areas of solder. By providing the enlarged footprint, the solder cross sectional area is substantially increased thereby reducing the likelihood of electromigration.

It is also during this solder reflow operation that the layer 214 is fully cured. In this way, the layer 214 is substantially free of voids and the segregation of the resin and silica found in most layers of conventionally produced underfill encapsulants is essentially avoided.

In one embodiment of the invention, the underfill encapsulant is formed of a silica filled polymer resin having dual stage curing chemistry with specific, uncured, pre-cured, and fully cured properties, having, for example, an initial viscosity in the range of approximately 350,000 to approximately 850,000 cP. Examples of such a resin include epoxies, polyimides, and silicone-polyimide co-polymers. The selection of the proper combination of initiators is important. Such a combination would typically include two components, one with a low decomposition temperature (e.g. about 50° C. to about 90° C.) while the other has a high decomposition temperature in the vicinity of eutectic solder reflow temperature (e.g., about 170° C. to about 190° C.). The first initiator will start the "soft cure". In other words, the material will be partially reacted so that a material consistency can be reached to allow for easy post processing and handling. Wafer dicing, for instance, would be facilitated by a soft cure that produces a semi-rigid coating rather than a gel-like state. The second initiator will decompose only when the singulated die is placed on a substrate for assembly. The higher temperature needed to reflow the solder would complete the reaction in the polymer so that the final cured hardened state can be achieved once solder has wetted the pads on the substrate.

Once the underfill material is cured, it should have specific thermal and mechanical properties to reduce the effects of thermal stresses without adversely affecting thermal performance of the flip chip. The cured underfill material should have an elastic modulus in the range of 1 to 10 GPa. A mismatch between the coefficient of thermal expansion of the flip chip and the substrate on which the flip chip is attached exerts a shear stress on the solder joint. The function of the underfill is to provide additional (high strength) material in the plane of the solder joints across which the stresses can be distributed. Modulus values in the range 1 to 10 GPa specified above allow the underfill to distribute these stresses without exceeding the fracture strength of the silicon.

The underfill should have a coefficient of thermal expansion (CTE) in the range of approximately 20 to approximately $30 \times 10^{-6}$/K. In order to reduce thermally induced stress, the coefficient of thermal expansion value of typical solders is also in this range. Having close agreement between the CTE values of these materials minimizes the generation of shear stresses between the underfill and the solder joints. One advantage to reducing thermal stress is that the overall reliability of the electrical connection formed by the solder joint is greatly enhanced.

Figure 6:
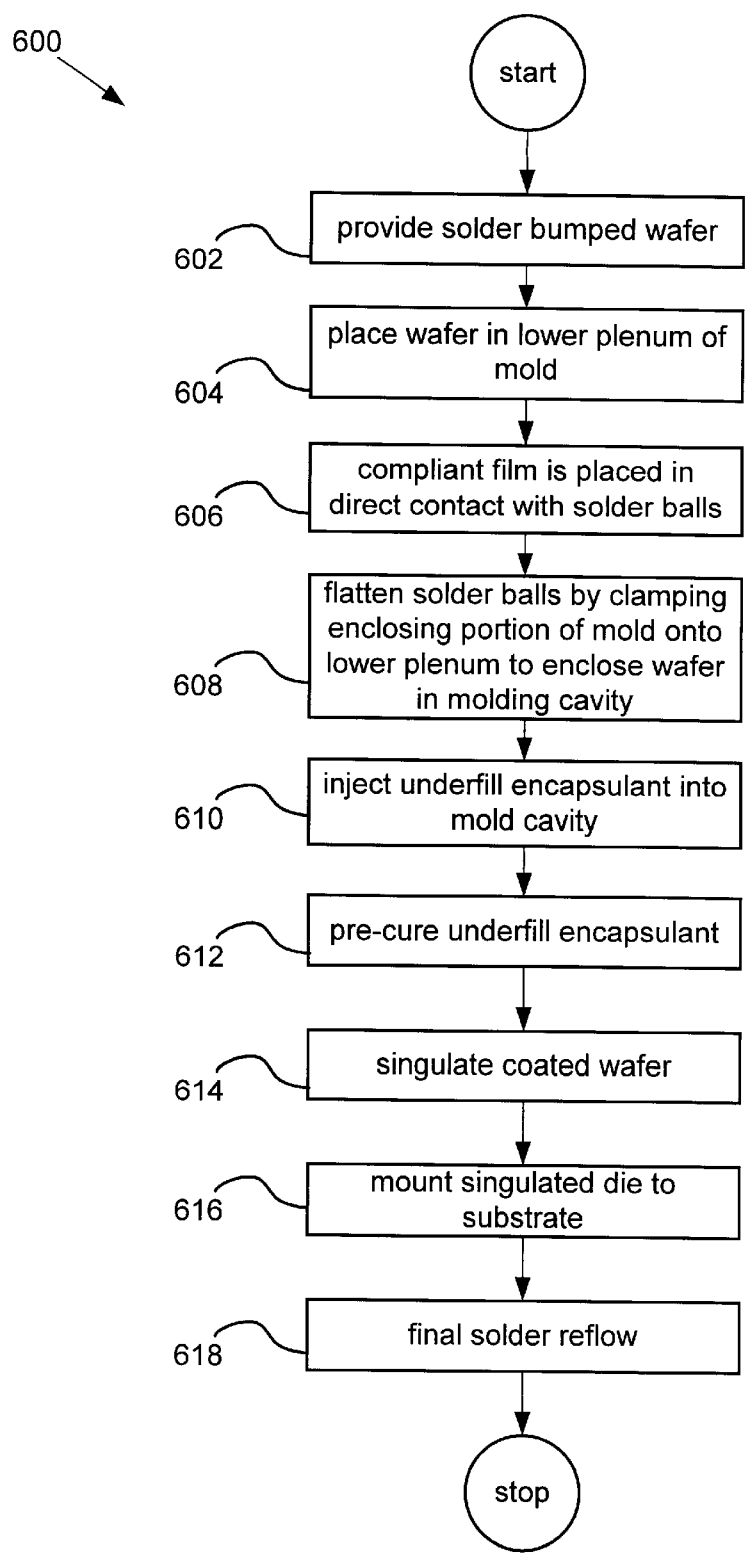
FIG. 6 illustrates a flowchart detailing a process for fabricating a flip chip integrated circuit in accordance with an embodiment of the invention.

Referring now to FIG. 6 which presents a flowchart detailing a process 600 for singulating and mounting a flip chip integrated circuit in accordance with an embodiment of the invention. The process 600 begins at 602 by providing an appropriately solder bumped wafer. It is essential that those individual dies contemplated to be singulated and mounted on, for example, a substrate have underbump metallization pads that are appropriately solder bumped. It is also important that the range in size of the solder bumps be well controlled since individual solder bumps whose size varies substantially (either larger or smaller) can experience over or under flattening resulting in larger or smaller footprints, respectively, than considered desirable. Once the appropriate underbump metallization pads on the selected dies are solder bumped, the wafer is placed within a lower plenum of a mold at 604 that is suitably arranged to receive the underfill encapsulant. In one embodiment, the mold is coupled to a reservoir such as a gang pot capable of storing appropriate amounts of underfill encapsulant until such time as, under pressure, it is forced onto the wafer. At 606, a compliant film is placed in direct contact with the upper surfaces of the solder bumps in such a way that when an upper portion of the mold is clamped in place at 608, the solder bumps are flattened. The amount of flattening is determinable by the depth of the cavity and the thickness of the compliant film. It is this flattening that affords the solder bumps a larger footprint and therefore, greater solder wetting area.

Once the wafer is clamped into the mold cavity, the underfill encapsulant is forced into the cavity at 610. Typically, a gas vent avoids entrapment of gases by providing a mechanism for removing excess gases during the injection. A pre-cure is performed at 612 in which the temperature of the coated wafer is raised such that the underfill encapsulant gels or soft cures. Since the underfill encapsulant possesses a dual stage cure chemistry, the underfill encapsulant becomes tacky and somewhat resilient but not fully cured. The coated wafer is then removed from the mold at 614 and, in one embodiment, using singulation guides provided by indentations in the upper portion of the mold, the die is singulated. In some cases, the die is singulated by using a wafer saw, in other cases, laser tools can be used. In either case, it is very useful to have definitive visible singulation guides so as to avoid yield loss due to cutting the die and not the associated saw streets.

Once the die is singulated, it is directly aligned with and mounted on a substrate at 616. During the aligning, the solder bumped underbumped metallization pads on the coated die are directly aligned to corresponding substrate bond pads that are eventually coupled to external circuitry. It is important that the aligning be performed in a well controlled manner as any substantial mis-alignment has the potential to cause a non functional or functional but unreliable packaged flip chip. Non functionality can be caused by lack of electrical contacts between corresponding underbump metallization pads and substrate bond pads whereas unreliable flip chip packages can be caused by poor electrical connections resulting in subsequent problems related to electromigration, for example.

One of the advantages of the invention is that since the underfill encapsulant is only soft cured at this point, any mis-alignment that is discovered during inspections, for example, can be readily corrected due to the fact that some degree of self-alignment is possible due to the fact that the underfill is still soft and malleable. Once the die and the substrate are appropriately aligned and mounted, a final solder reflow is performed at 618. It is during this solder reflow that the enlarged solder ball footprint providing a greater wetting enhances the probability of forming good electrical connections between the underbump metallization pads and the substrate pads. It is also during this solder reflow that the underfill encapsulant is fully cured providing a strong, unvoided, and uniform layer juxtaposed between the flip chip die and the substrate.

Figure 7:
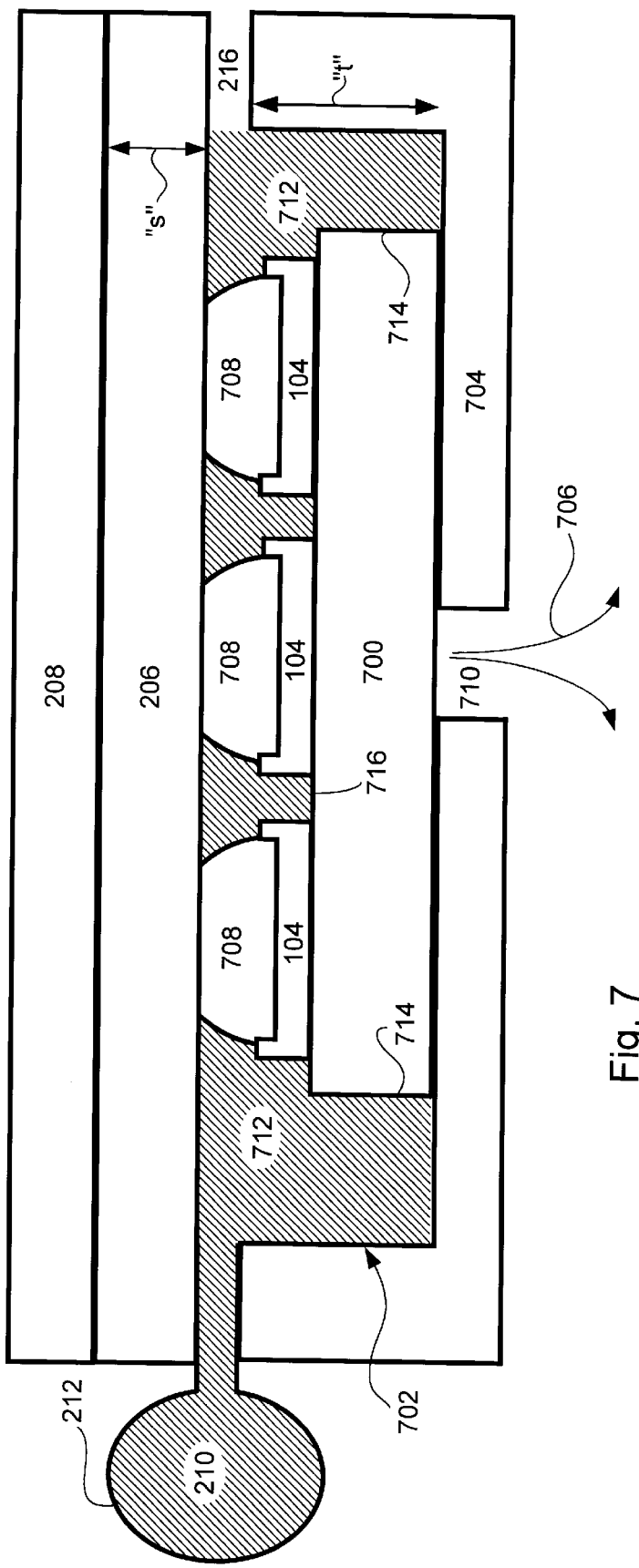
FIG. 7 illustrates a known good die in a mold chamber in accordance with another embodiment of the invention.

Referring now to FIG. 7 showing a singulated known good die 700 enclosed in a mold chamber to be coated with underfill encapsulant in yet another embodiment of the invention. The singulated die 700 is placed within a mold cavity 702 as part of a mold 704. The die 700 is held in place by way of, in this example, suction created by a vacuum 706 applied by way of a plenum 710. As with previous embodiments, the film 206 is used in conjunction with the enclosing portion 208 of the mold 704 to flatten the solder balls 708. In this arrangement, however, the layer of underfill encapsulant 712 envelops the sides 714 of the die 700 as well as an active surface 716 of the die 700.

Since only known good die are selected for encapsulation in this embodiment, the possibility of encapsulating (by mistake) die that have failed pre-assembly functional testing of whatever nature is effectively eliminated.

There are many possibilities of packaging contemplated that include, for example, plastic type encapsulants, ceramic-type encapsulants, or in some cases, the flip chip/substrate can be electrically coupled directly to a printed circuit board, or may even be connected to another die in, for example, modules. The invention is also suited by producing chip on chip package modules where the underfill encapsulant is juxtaposed between a daughter chip and mother chip and the associated substrate.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein but may be modified within the scope of the appended claims.

In the claims:

1. A method for forming a layer of underfill encapsulant on an integrated circuit having an active surface that includes electrically conductive pads selected ones of which have a solder ball bonded thereto, comprising:

flattening a portion of most of the solder balls;

forming a pre-cured layer of underfill encapsulant having a dual stage curing chemistry that includes a pre-cure stage and a final cure stage on the active surface of the integrated circuit such that the flattened solder ball is covered by the pre-cured encapsulant in such a manner that the flattened portion is substantially free of the pre-cured encapsulant; and reflowing the flattened solder balls so as to final cure the underfill encapsulant during the final cure stage such that there are substantially no voided regions between the substrate and the flip chip integrated circuit such that there is substantially no segregation of the layer of underfill encapsulant.

2. A method as recited in claim 1, wherein the integrated circuit is a flip chip integrated circuit located on a wafer having flip chip bond pads for electrically coupling the flip chip integrated circuit to external circuitry.

3. A method as recited in claim 1, wherein the flattening comprises:

placing a resilient film coplanar to the active surface and in direct contact with the solder ball; and providing a force to the resilient film normal to the active surface.

4. A method as recited in claim 3, further comprising:

providing a mold having a mold cavity portion suitably arranged to receive the wafer and the encapsulant;

placing the wafer and the resilient film in the mold cavity portion; and clamping an enclosing portion of the mold on to the mold cavity portion thereby enclosing the wafer and the film in the mold cavity portion.

5. A method as recited in claim 4, where the clamping the enclosing portion provides the force to the resilient film normal to the active surface so that the solder ball is flattened in such a way that a solder ball footprint corresponding to the flattened solder ball is substantially enlarged thereby increasing available solder wetting area.

6. A method as recited in claim 5, wherein the forming the encapsulation layer comprises injecting encapsulant under pressure into the mold cavity.

7. A method as recited in claim 6, wherein the enclosing portion of the mold includes indentations each of which corresponds to and directly aligns with a corresponding saw street on the active surface such that each of the indentations form a corresponding groove in the layer of encapsulant suitable for identifying the corresponding saw street.

8. A method as recited in claim 7, further comprising:

singulating the flip chip integrated circuit.

9. A method as recited in claim 8, wherein the singulating comprises:

wafer sawing the flip chip integrated circuit.

10. A method as recited in claim 8, wherein the singulating comprises:

laser cutting the flip chip integrated circuit.

11. A method as recited in claim 10, further comprising:

aligning the singulated flip chip integrated circuit to a substrate such that selected ones of the flip chip bond pads having flattened solder balls are directly aligned to corresponding substrate bond pads included on the substrate; and mounting the flip chip integrated circuit on the substrate such that each of the selected flip chip bond pads are in direct contact with the corresponding substrate bond pad.

12. A method as recited in claim 11, wherein the underfill encapsulant is selected from the group comprising: epoxies, polyimides, and silicon-polyimide copolymers.

13. A method for forming a layer of underfill encapsulant on an integrated circuit having an active surface that includes electrically conductive pads wherein selected ones of the pads each have a solder ball connected thereto, comprising:

flattening the solder balls by,
placing a resilient film coplanar to the active surface and in direct contact with the solder balls, and
providing a force to the resilient film normal to the active surface so that the solder balls are flattened in such a way that a solder ball footprint corresponding to the flattened solder balls is substantially enlarged thereby increasing available solder wetting area;

forming the layer of underfill encapsulant having a dual stage curing chemistry that includes a pre-cure stage and a final cure stage on the active surface of the integrated circuit, wherein a flattened portion of the solder balls remain substantially free of encapsulant by,
providing a mold having a mold cavity portion suitably arranged to receive the wafer and the encapsulant;
placing the wafer and the resilient film in the mold cavity portion;
clamping an enclosing portion of the mold on to the mold cavity portion thereby enclosing the wafer and the film in the mold cavity portion;
injecting the underfill encapsulant under pressure into the mold cavity, pre-curing the injected underfill encapsulant during the pre-cure stage; and reflowing the solder balls so as to final cure the underfill encapsulant during the final cure stage such that there are substantially no voided regions in the layer of underfill encapsulant.

14. A method as recited in claim 13, wherein the integrated circuit is a flip chip integrated circuit having flip chip bond pads for electrically coupling the flip chip integrated circuit to external circuitry.

15. A method as recited in claim 14, further comprising:

aligning the flip chip bond pads having flattened solder balls to corresponding substrate bond pads included on a substrate; and mounting the flip chip integrated circuit on the substrate such that each of the flip chip bond pads is in direct contact with the corresponding substrate bond pad.

* * * * *